United States Patent

[11] 3,628,188

[72] Inventor Martin Fischman
Wantagh, N.Y.

[21] Appl. No. 29
[22] Filed Jan. 2, 1970
[45] Patented Dec. 14, 1971
[73] Assignee GTE Laboratories Incorporated

[54] LC STABILIZED BLOCKING OSCILLATOR WITH INTERNAL TUNNEL DIODE TRIGGER CIRCUIT
11 Claims, 3 Drawing Figs.

[52] U.S. Cl. ........................................................ 331/112,
331/107 T, 331/117 R, 331/148, 331/149
[51] Int. Cl. ........................................................ H03k 3/30
[50] Field of Search ............................................ 331/112,
117, 146, 148, 107 T, 149

[56] References Cited
UNITED STATES PATENTS
3,013,219 12/1961 Fischman .................... 331/112
3,290,612 12/1966 Burrus .......................... 331/112

*Primary Examiner*—Roy Lake
*Assistant Examiner*—Siegfried H. Grimm
*Attorney*—Irving M. Kriegsman

ABSTRACT: A transistorized pulse generator comprising a first resonant circuit for generating pulses having a precisely controlled width and a second resonant circuit, tunnel diode and differentiator network for precisely controlling the duration of the interpulse period. The first resonant circuit is connected in the base-emitter circuit of the transistor and the second resonant circuit tunnel diode and differentiator network coupled between the collector-emitter and base circuits of the transistor.

INVENTOR.
MARTIN FISCHMAN

R. J. Frank
ATTORNEY.

LC STABILIZED BLOCKING OSCILLATOR WITH INTERNAL TUNNEL DIODE TRIGGER CIRCUIT

BACKGROUND OF THE INVENTION

This invention relates to pulse generators and in particular to the type commonly known as blocking oscillators.

Pulse generators which produce pulses having steep leading and trailing edges and stabilized pulse and interpulse periods find wide application in electronic devices. These known pulse generators are frequently of the blocking oscillator type in which the duration of the pulse and interpulse periods are controlled by a resistance-capacitance network. It has been found, however, that both pulse and interpulse periods of these circuits are subject to wide variations caused by changes in power supply voltage, transistor characteristics and circuit loading.

In U.S. Pat. No. 3,038,128, dated June 5, 1962, and assigned to the same assignee as this application, there is disclosed a blocking oscillator which employs a series resonant circuit to control the pulse duration. In this patent it was also proposed to use synchronizing pulses from a source external to the blocking oscillator to improve the stability of the interpulse period. While this solution is satisfactory in those circuit applications in which external synchronizing pulses are available, it is not always practical to provide a suitable external source. Accordingly, I have invented a blocking oscillator which generates pulses of precise duration and wherein the interpulse period is stabilized by internal means.

SUMMARY OF THE INVENTION

According to the present invention, a pulse generator is provided wherein both the pulse and interpulse periods are maintained substantially independent of ordinary variations in circuit operating parameters. In addition, both the pulse and interpulse periods are individually variable.

The pulse generator comprises a transistor having first, second and third electrodes, first and second resonant circuits and a transformer having at least two windings. The first winding of the transformer, the first resonant circuit and the first and second electrodes of the transistor are connected in series while the second winding of the transformer is coupled to the third electrode of the transformer. The second resonant circuit is coupled between the first and third electrodes of the transistor. Switching means having a first state wherein it exhibits a low voltage and a second state wherein it exhibits a relatively high voltage is coupled to the second resonant circuit and to the second electrode of the transistor.

Under steady state operating conditions, and assuming that the leading edge of the output pulse has passed, a large sinusoidal current circulates through the series circuit consisting of the first resonant circuit, the first and second electrodes of the transistor and the first winding of the transformer. During the one-half cycle of this current the transistor is driven into the saturation state and an output pulse is generated. At the completion of the half cycle of current, the direction of current flow reverses thereby causing the transistor to turn off, preventing further sinusoidal current from circulating in the series circuit and terminating the output pulse. Thus, the duration of the generated output pulse corresponds to the resonant frequency of the first resonant circuit.

The output pulse is also coupled to the second resonant circuit wherein it produces a sinusoidal current and voltage varying at the resonant frequency of the second resonant circuit. When the sinusoidal current flowing through the switching means passes a first threshold level an abrupt change in the voltage across the switching means occurs. This voltage state is maintained until the current passes a second threshold level thereby causing the switching means to abruptly revert to its initial voltage state. A trigger pulse derived from voltage variation across the switching means is coupled to the second electrode of the transistor thereby returning the transistor to the saturation state and causing another output pulse to be generated. The interval between trigger pulses and consequently the interpulse duration of the pulse generator corresponds to the resonant frequency of the second resonant circuit.

In a preferred embodiment of the invention, the first, second and third electrodes of the transistor are the emitter, base and collector electrodes respectively and the first resonant circuit comprises a series-connected capacitor and inductor. The second resonant circuit comprises an inductor and capacitor and the switching means is a tunnel diode connected in series with the inductor. The tunnel diode is coupled to the base of the transistor by a differentiator network.

DESCRIPTION OF THE PREFERRED EMBODIMENT

Figure 1:
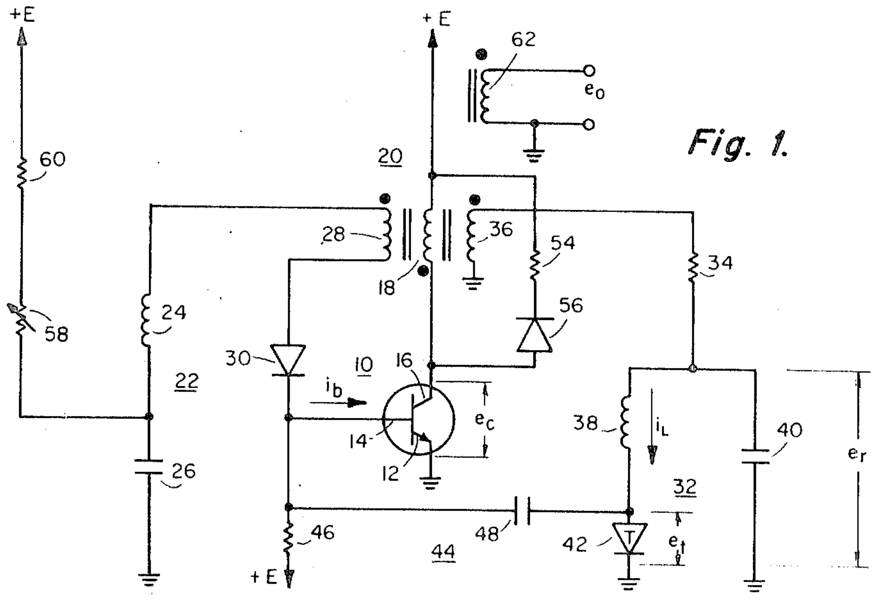
FIG. 1 is a schematic diagram of the pulse generator of the present invention.

The pulse generator of my invention, as illustrated in FIG. 1, makes use of a type NPN transistor 10 having emitter, base and collector electrodes 12, 14 and 16 respectively. The collector 16 is maintained at a positive potential with respect to grounded emitter 12 by a voltage applied through winding 18 of feedback transformer 20. A series resonant circuit 22 consisting of inductor 24 and capacitor 26 is connected between one end of winding 28 of feedback transformer 20 and a reference potential or ground. The other end of winding 28 is connected to the first electrode of diode 30 while the second electrode of diode 30 is connected to the base 14 of transistor 10.

A second resonant circuit 32 is connected through a resistor 34 across winding 36 of transformer 20. Resonant circuit 32 comprises an inductor 38 and capacitor 40, a tunnel diode 42 being connected in series with inductor 38. A differentiator network 44, consisting of a resistor 46 and a capacitor 48 couples the junction of inductor 38 and tunnel diode 42 to the base 14 of transistor 10. Positive bias voltage is applied to the base 14 of transistor 10 through the differentiator network resistor 46.

Operation of the circuit is best described by reference to the steady state conditions wherein the pulse generator has been operating for sufficient time so as to allow initial starting transients to die down. In this steady state mode of operation and assuming the leading edge of the output pulse has been completed, transistor 10 is in the saturation or conducting state resulting in a voltage $e_c$ at collector 16 which is near zero as shown at 50 in FIG. 2. With the transistor conducting, a sinusoidal current flows in series resonant circuit 22 and the base-emitter circuit of transistor 10. The base current $i_b$ flows in the direction shown in FIG. 1 and is of sufficient magnitude to maintain the transistor in its conducting state. After completion of one-half cycle, the current in resonant circuit 22 and consequently the current in the base-emitter circuit reverses thereby driving the transistor into the nonconducting state. With the transistor nonconducting the collector voltage abruptly changes to a value +E as indicated at 52 in FIG. 2. Switching transients are damped out and uncontrolled retriggering of the pulse generator prevented by a resistor 54 and diode 56 coupled across winding 18 of transformer 20. An output pulse is thereby produced having a precise width dependent on the resonant frequency of the series resonant circuit.

At the completion of this half cycle of sinusoidal base current, capacitor 26 is charged with proper polarity to maintain the transistor nonconducting during the time between pulses. Discharge resistors 58 and 60 are made large enough so that sufficient charge is maintained in capacitor 26 to prevent retriggering of the pulse generator during the interpulse interval and to reverse bias diode 30 during this interval.

Figure 2:
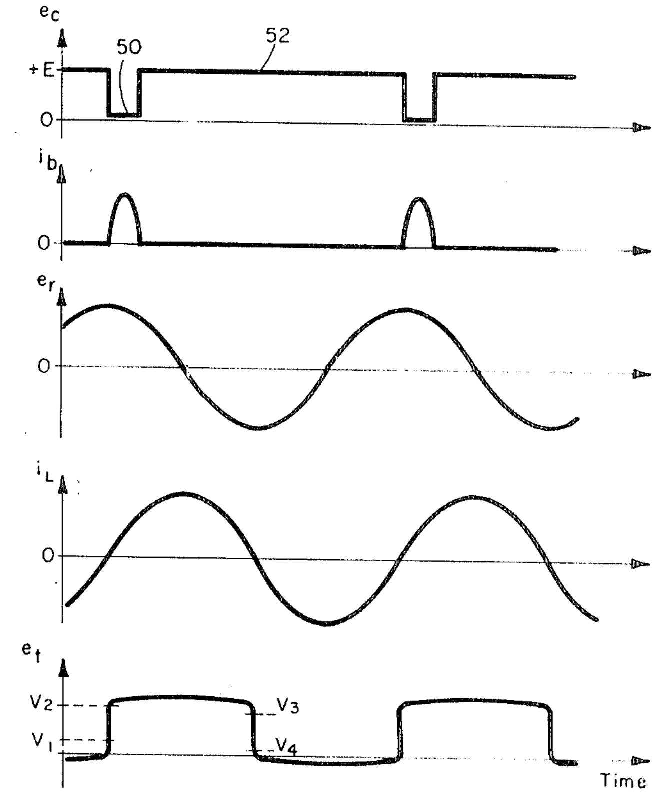
FIG. 2 represents idealized current and voltage waveforms appearing in the circuit of FIG. 1.
Figure 3:
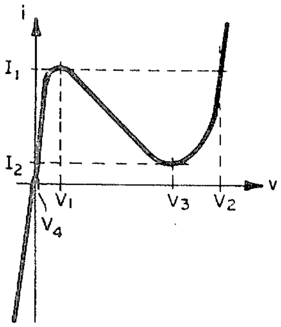
FIG. 3 shows the voltage-current characteristic of a typical tunnel diode.

The output pulse of the pulse generator produces a voltage, $e_r$, (FIG. 2) across capacitor 40 having a frequency determined primarily by the value of inductor 38 and capacitor 40, the tunnel diode having no significant effect on the resonant frequency. A current $i_L$, which is in quadrature with the voltage $e_r$ flows in the series-connected inductor and tunnel diode of resonant circuit 32. As the magnitude of the current through the tunnel diode increases during its positive half cycle, the voltage across the diode also increases (FIG. 3). When the magnitude of the current passes a threshold level $I_1$, the voltage across the tunnel diode increases abruptly from $V_1$ to $V_2$. As the current in the resonant circuit continues to increase to a maximum value, the voltage across the tunnel diode remains substantially constant. After passing the maximum value the diode current decreases until it reaches a value $I_2$. When current falls below $I_2$ the voltage across the tunnel diode decreases abruptly from $V_3$ to $V_4$. During the negative half cycle of the series resonant current, the voltage across the tunnel diode is slightly negative. The variation in voltage $e_t$ across the tunnel diode with respect to time is essentially a square wave as shown in FIG. 2. If the current $i_L$ is large in comparison with the threshold values of the tunnel diode, the change in voltage levels across the tunnel diode 42 will occur when the magnitude of the current is relatively small with respect to its maximum value. Changes in voltage level occur at an extremely rapid rate, tunnel diodes having a rise time (time required for the voltage to change from 10 percent to 90 percent of its final value) of 1–2 nanoseconds are common. This fast switching time makes possible the accurate timing of the interpulse duration.

The square wave voltage variation across tunnel diode 42 is applied to a differentiator network 44 consisting of resistor 46 and capacitor 48. The output of the differentiator is a short duration pulse which is applied to the base 14 of transistor 10 so as to return the transistor to the saturation state and forward bias diode 30 thereby triggering the next output pulse. Transformer 20 provides regenerative feedback from the collector to the base of transistor 10 through windings 18 and 28 respectively. An increase in the current flow in the base circuit causes a corresponding increase in the current through the collector-emitter circuit and winding 18 of transformer 20 which induces a corresponding increase in the current in winding 28 thereby further increasing the current in the emitter-base circuit. The magnitude of the feedback and gain of the transistor are such that the transistor collector current rapidly builds up, driving the transistor into the saturation state. The collector voltage then rapidly decreases toward zero and a sinusoidal current flows in the series tuned circuit 22.

Thus, this circuit produces pulses having accurately determined pulse width and frequency dependent only upon the resonant frequencies of the two resonant circuits. In order to obtain better triggering sensitivity the transistor may be biased slightly conducting during the entire pulse cycle. This is accomplished by providing a small base current to transistor 10 from the supply voltage through resistor 46. Diode 30 is reverse biased during the interpulse interval by the charge on capacitor 26 in order to open the feedback loop from collector 16 through transformer windings 18 and 28 and prevent regenerative feedback.

Transistor 10 may be of PNP type if desired, in which case the supply voltage and polarity of diodes 30 and 56 must be reversed. The output pulse may be obtained either by coupling from winding 36 of transformer 20 or through the use of a fourth winding, such as winding 62 which provides an electrically isolated output for the pulse generator. In addition, parallel resonant circuit 32 could be coupled directly to winding 18 of transformer 20 and winding 36 omitted. In a typical circuit, the values of the components are as follows:

| | |
|---|---|
| Transistor 10 | 2N2086 |
| Inductor 24 | 1 millihenry |
| Capacitor 26 | 0.001 microfarad |
| Diode 30 | IN 279 |

| | |
|---|---|
| Resistor 34 | 10,000 ohms |
| Inductor 38 | 10 millihenries |
| Capacitor 40 | 0.01 microfarad |
| Tunnel Diode 42 | IN 2940 |
| Resistor 46 | 100,000 ohms |
| Capacitor 48 | 560 picofarads |
| Resistor 54 | 100 ohms |
| Diode 56 | IN 279 |
| Resistor 58 | 100,000 ohms |
| Resistor 60 | 68,000 ohms |

The ratio of transformer windings=1: 3: 9 and the supply voltage E=+20 volts.

What is claimed is:

1. A pulse generator comprising:
a. a transistor having first, second and third electrodes,
b. a first resonant circuit,
c. a transformer having at least two windings, the first winding coupled in series with said first resonant circuit, said series-connected first resonant circuit and first winding of said transformer being coupled between the first and second electrodes of said transistor, the second winding of said transformer being coupled to the third electrode of said transistor,
d. a second resonant circuit coupled between the first and third electrodes of said transistor,
e. switching means coupled to said second resonant circuit, said switching means having a first state wherein it exhibits a low voltage and a second state wherein it exhibits a relatively high voltage, and
f. means for coupling said switching means to the second electrode of said transistor, the duration of the output pulse corresponding to the resonant frequency of said first resonant circuit and the duration of the interpulse period corresponding to the resonant frequency of said second resonant circuit.

2. The pulse generator of claim 1 further comprising:
a. a diode coupled in series with said series-connected first resonant circuit and first winding of the transformer and
b. voltage means coupled to the second electrode of said transistor, said voltage means applying a reference voltage to said second electrode.

3. The pulse generator of claim 1 wherein said second resonant circuit comprises an inductor and a capacitor.

4. The pulse generator of claim 1 wherein said switching means is a tunnel diode.

5. The pulse generator of claim 4 wherein said second resonant circuit includes an inductor connected in series with said tunnel diode.

6. The pulse generator of claim 5 wherein said means for coupling said switching means to the second electrode of said transistor consists of a differentiator network, said network providing a trigger pulse at the second electrode of said transistor, the time interval between trigger pulses corresponding to the resonant frequency of said second resonant circuit.

7. The pulse generator of claim 1 wherein the first, second and third electrodes of said transistor are the emitter, base and collector electrodes respectively.

8. A pulse generator comprising
a. a transistor having emitter, base and collector electrodes,
b. a first resonant circuit having one end coupled to the emitter of said transistor,
c. a diode having a first electrode coupled to the base of said transistor,
d. a transformer having at least first, second and third windings, the first winding of said transformer being coupled between the other end of said series resonant circuit and a second electrode of said diode, the second winding of said transformer being coupled to the collector electrode of said transistor, the third winding of said transformer having one end coupled to the emitter of said transistor,
e. a second resonant circuit comprising an inductor and a capacitor having a common connection coupled to the other end of the third winding of said transformer, the other end of said capacitor being coupled to the emitter of said transistor, f. a tunnel diode coupled between the other end of said inductor and the emitter of said transistor, g. a differentiator network coupled between the junction of said inductor and tunnel diode and the base of said transistor, the duration of the output pulse corresponding to the resonant frequency of said first resonant circuit and the duration of the interpulse period corresponding to the resonant frequency of said second resonant circuit.

9. The pulse generator of claim 8 wherein said transformer has a fourth winding said fourth winding being adapted for connections to an external load.

10. The pulse generator of claim 8 wherein said first resonant circuit comprises a series-connected capacitor and inductor.

11. The pulse generator of claim 8 wherein said differentiator network comprises a. a capacitor coupled between the junction of said inductor and tunnel diode and the base of said transistor and b. a resistor coupled between the base and emitter of said transistor.

* * * * *